(12) United States Patent
Lim

(10) Patent No.: US 6,518,131 B1
(45) Date of Patent: Feb. 11, 2003

(54) METHOD FOR FABRICATING MASK ROM

(75) Inventor: Min Gyu Lim, Chungcheongbuk-do (KR)

(73) Assignee: Dongbu Electronics, Co. Ltd., Seoul (KR)

( * ) Notice: Subject to any disclaimer, the term of this patent is extended or adjusted under 35 U.S.C. 154(b) by 0 days.

(21) Appl. No.: 10/053,381

(22) Filed: Nov. 7, 2001

(30) Foreign Application Priority Data

Aug. 27, 2001 (KR) ........................................ 2001-51827

(51) Int. Cl.⁷ .......................................... H01L 21/8246
(52) U.S. Cl. ...................................... 438/275; 438/278
(58) Field of Search ................................. 438/275–279

(56) References Cited

U.S. PATENT DOCUMENTS 6,180,463 B1    1/2001   Otsuki
6,346,771 B1 *  2/2002   Salam ........................ 313/498

* cited by examiner

*Primary Examiner*—Jey Tsai
(74) *Attorney, Agent, or Firm*—Timothy J. Keefer; Wildman, Harrold, Allen & Dixon

(57) ABSTRACT

A method that includes: providing a substrate where a memory cell array region and a peripheral region are defined; forming a buried layer on the substrate; forming a gate material by positioning a gate insulating film on the substrate having the buried layer; forming first gates by covering the peripheral region, and etching the gate material of the memory cell array region according to a photolithography process; forming an insulating pattern on the substrate to fill up a space between the first gates and expose the surfaces of the first gates; forming second gates by covering the memory cell array region, and etching the gate material of the peripheral region according to the photolithography process; and forming a low resistance layer on the first gates, and simultaneously forming a source/drain at both sides of the second gates, by doping an impurity to the substrate having the first and second gates.

10 Claims, 15 Drawing Sheets

METHOD FOR FABRICATING MASK ROM

CROSS REFERENCE TO RELATED APPLICATION

This application claims the priority of Korean patent application Serial No. 2001-51827 filed on Aug. 27, 2001.

BACKGROUND OF THE INVENTION

1. Field of the Invention

The present invention relates to a method for fabricating a mask ROM, and in particular to an improved method for fabricating a mask ROM which can apply a dual gate process and a salicide process of a logic process to a flat cell type mask ROM.

2. Description of the Background Art

A mask ROM is a non-volatile device which uses a mask process in an element isolation process, a metal process or an ion implant process for a channel region of a memory cell. For example, a threshold voltage difference is generated between a memory cell where the ion implant process is performed and a memory cell where the ion implant process is not performed. By using such a difference, the mask ROM discriminates data and records necessary information.

FIG. 1 is a layout diagram illustrating a conventional cell array.

A flat cell type mask ROM has been widely used in a fabrication method using a logic process.

Referring to FIG. 1, in the fabrication process of the flat cell type mask ROM, an isolation process is performed at the outer portion of a memory cell array region 10 to surround the whole memory cell array region 10, instead of performing a LOCOS or STI process for isolating memory cells. A source/drain junction of the memory cell is a buried layer 116 formed before the gate process. It is thus unnecessary to isolate the junctions. A contact hole 150 of the buried layer junction does not exist in the memory cell array region 10 but in a segment select region 20. In addition, a gate 125 is formed in an orthogonal direction to the buried layer junction, and a width of the gate 125 is a channel width of the memory cell.

As described above, an isolating pattern and a contact hole are not formed in the memory cell, and thus a size of the memory cell is about $4F^2$ ('F' implies a minimum line width of photolithography), thereby improving integration, simplifying the whole process and cutting down production costs.

When a logic process of a design rule below 0.35 μm is applied to the fabrication process of the flat cell type mask ROM, 1) the isolation process is performed by LOCOS, 2) N type impurity-doped polysilicon, Ti-Salicide or W-Polycide is used as the gate formation material, and 3) Ti-Salicide identical to the gate formation material is employed as the source/drain junction.

In addition, when the flat cell type mask ROM is fabricated according to a logic process of a design rule below 0.25 μm, 1) the isolation process is performed to surround the whole memory cell array region by a trench STI, 2) Ti-Salicide or Co-Salicide is used as the gate formation material, and 3) Ti-Salicide or Co-Salicide identical to the gate formation material is employed as the source/drain junction.

Accordingly, the flat cell type mask ROM having compatibility with the logic process of a design rule below 0.35 μm has been commercially used. There are therefore increasing demands for a flat cell process having compatibility with the logic process below 0.25 μm.

FIG. 2 is a flowchart showing a conventional process for fabricating a mask ROM.

As illustrated in FIG. 2, the conventional method for fabricating the mask ROM includes: an isolation process for forming an element isolating film at the outer portion of a memory cell array region; a well formation process; a buried layer formation process; a process for forming a gate insulating film and gates in the memory cell array region and its peripheral region; a cell isolation ion implant process for implanting ions to the memory cell array region; a process for forming a source/drain in the gates of the peripheral region; a coding process; a process for forming a contact hole in a buried layer of a segment select region; and a bit line formation process.

FIGS. 3a through 3f are cross-sectional diagrams illustrating sequential steps of the conventional method for fabricating the mask ROM, taken along lines A–B and C–D of FIG. 1. In FIGS. 3a to 3f, region 'I' denotes a section taken along line A–B, and regions 'II', 'III' denote sections taken along line C–D.

The conventional method for fabricating the mask ROM will now be described by using the logic process of a design rule below 0.35 μm.

As depicted in FIG. 3a, provided is a substrate 100 where a memory cell array region I+II and a peripheral region III formed at the outer portion of the region 10 are defined.

An element isolating film 103 is formed at the outer portion of the memory cell array region I+II of the substrate 100 according to a LOCOS process.

Thereafter, a well 102 is formed on the substrate 100 having the element isolating film 103. At this time, the element isolating film formation process and the well formation process may be performed in an inverse order.

As illustrated in FIG. 3b, a photoresist film is coated on the substrate 100 having the element isolating film 103 and the well 102, and exposed and developed to form a first photoresist film pattern 104 opening a predetermined region. Here, a buffer oxide film 105 is positioned between the substrate 100 and the first photoresist film pattern 104.

An N-type $As^+$ ion implant process 106 is performed on the substrate 100 by using the first photoresist film pattern 104 as a mask. Reference numeral 108 denotes an $As^+$ ion layer implanted to the substrate 100 at a predetermined depth.

Then, the first photoresist film pattern 104 is removed, and a thermal treatment (not shown) is carried out on the $As^+$ implanted substrate 100. Here, $As^+$ ions are diffused according to the thermal treatment, thereby forming a buried layer 116. At the same time, an oxide film 112 is formed on the buried layer 116.

Referring to FIG. 3c, a gate oxide film 122 and a gate formation material layer 125 are sequentially formed on the substrate 100 having the buried layer 116 and the oxide film 112. The gate formation material layer 125 is formed by sequentially depositing a silicon layer such as a doped polysilicon or amorphous silicon layer, a metal layer such as a Ti or W layer having a low resistance value for high speed signal transmission, and a nitride film.

As illustrated in FIG. 3d, a second mask pattern (not shown) covering the gate formation region of the peripheral region III and the memory cell array region I+II is formed on the formation material layer 125. The gate formation material layer 125 is etched by using the second mask pattern, to form gates 125 in the memory cell array region I+II and the peripheral region III. When the gate formation material layer 125 is etched, an exposed silicon region 126 is an interval between memory cell channels.

A photoresist film is coated on the substrate 100, and exposed and developed to form a third photoresist film pattern 130 exposing the memory cell array region 10 and covering the peripheral region III.

An ion implant process for cell isolation 132 is performed on the intervals 126 between the channels of the memory cell array region I+II, by using the third photoresist film pattern 130 as a mask. The third photoresist film pattern is removed. As shown in FIG. 3e, a photoresist film is coated on the substrate 100, and exposed and developed to form a fourth photoresist film pattern 134 covering the memory cell array region I+II and exposing the peripheral region III.

Thereafter, LDD ions are implanted to the substrate 100 at both sides of the gate 125 of the peripheral region III, by employing the fourth photoresist film pattern 134 as a mask. An insulating spacer 138 is formed at the side walls of the gate 125. A source/drain impurity implant process 136 is performed on the substrate 100 by using the insulating spacer 138 including the gate 125 as a mask, thereby forming a source/drain.

A data coding ion implant process is carried out to record data. Referring to FIG. 3f, a protective film 142 is formed by depositing BPSG to fill up the space between the gates 125 of the memory cell. The protective film 142 is planarized according to an etch back process or a chemical mechanical polishing process.

As illustrated in FIG. 1, the contact hole 150 is formed on the buried layer 116 of the segment select region 20, and a bit line (not shown) of the memory cell is formed. Thus, fabrication of the flat cell type mask ROM is finished.

The conventional method for fabricating the flat cell type mask ROM using the logic process of a design rule below 0.35 μm deposits doped polysilicon (or amorphous silicon) as the gate formation material, and thus does not require a special impurity doping process. The W-Polycide or W-Silicide process is performed to reduce resistance of the gate.

However, when the flat cell type mask ROM is fabricated according to a logic process of a design rule below 0.25 μm based on a dual gate process, the gate doping process is carried out after depositing polysilicon or amorphous silicon, and thus the mask process is additionally performed.

Moreover, when polycide is formed to reduce the resistance of the gate, the gate doping process (arsenic and boron) is performed after depositing polysilicon or amorphous silicon. Accordingly, an additional ion implant system is necessary, and thus a process cost is increased. In addition, boron implanted to the gate in the thermal treatment after the gate doping process is penetrated into the active region.

In the logic process, when the salicide process is performed after the source/drain process, salicide is formed in the active region exposed to the interval between the gates of the memory cell, thus generating a short phenomenon between the adjacent buried layers.

SUMMARY OF THE INVENTION

Accordingly, it is an object of the present invention to provide a method for fabricating a mask ROM which can apply a gate doping process and a salicide process of a logic process to a flat cell.

In order to achieve the above-described object of the present invention, there is provided a method for fabricating a mask ROM including the steps of: providing a substrate where a memory cell array region and a peripheral region are defined; forming a buried layer on the substrate; forming a gate material by positioning a gate insulating film on the substrate having the buried layer; forming first gates by covering the peripheral region, and etching the gate material of the memory cell array region according to a photolithography process; forming an insulating pattern on the substrate to fill up a space between the first gates and expose the surfaces of the first gates; forming second gates by covering the memory cell array region, and etching the gate material of the peripheral region according to the photolithography process; and forming a low resistance layer on the first gates, and simultaneously forming a source/drain at both sides of the second gates, by doping an impurity to the substrate having the first and second gates.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a mask ROM in accordance with a preferred embodiment of the present invention will now be described in detail with reference to the accompanying drawings.

FIGS. 4a through 4g are cross-sectional diagrams illustrating sequential steps of the method for fabricating the mask ROM in accordance with the present invention. In FIGS. 4a to 4g, region 'IV' is a cross-sectional diagram of a cell cut in a horizontal direction to a gate, and regions 'V' and 'VI' are cross-sectional diagrams of a cell cut in a vertical direction to the gate.

Figure 1:
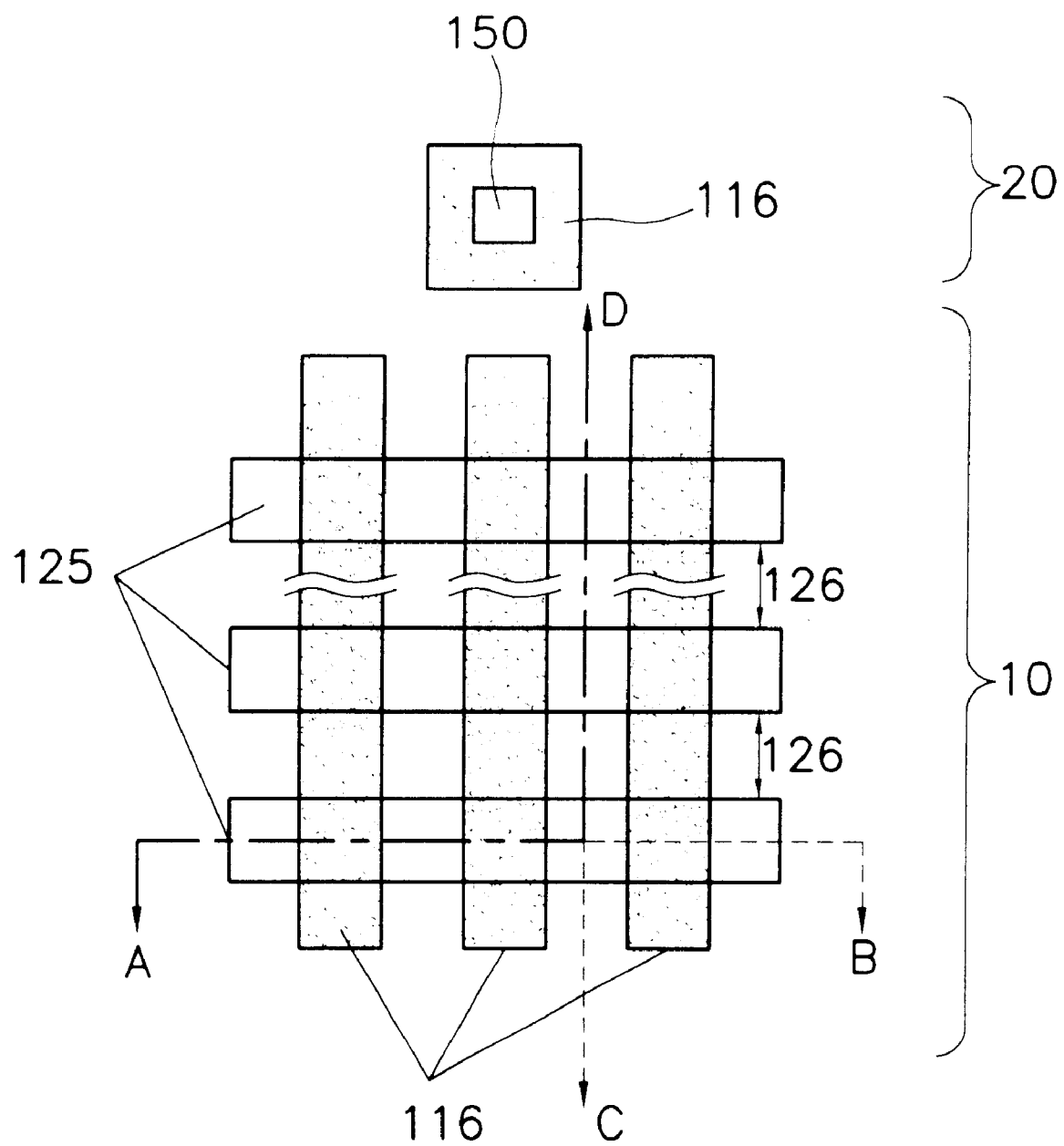
FIG. 1 is a layout diagram illustrating a conventional memory cell array.
Figure 2:
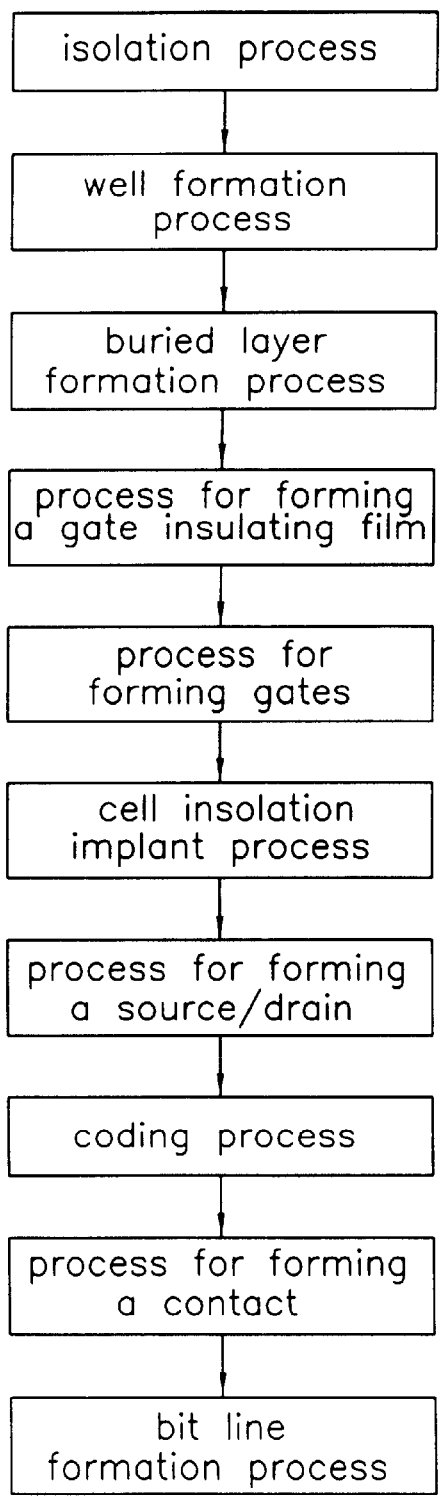
FIG. 2 is a flowchart showing a conventional process for fabricating a mask ROM.
Figure 3A:
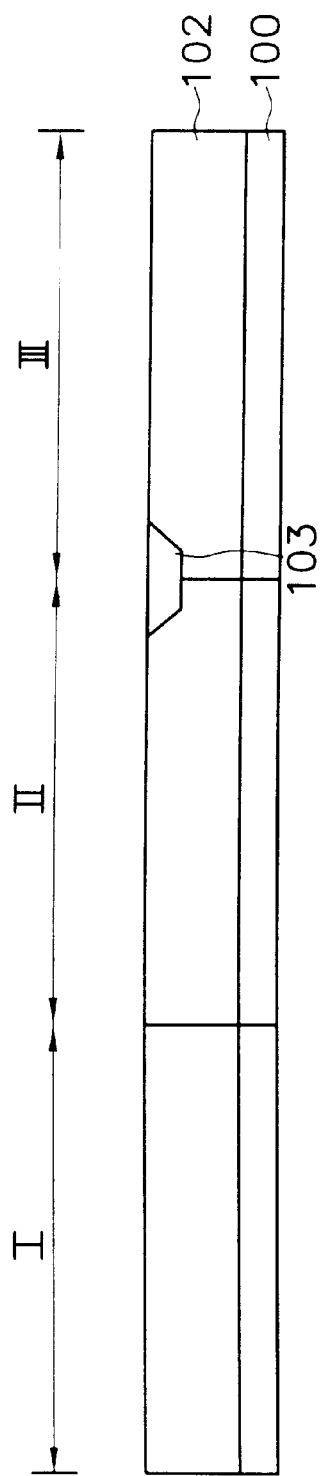
FIGS. 3a through 3f are cross-sectional diagrams illustrating sequential steps of the conventional method for fabricating the mask ROM, taken along lines A–B and C–D of FIG. 1.
Figure 3B:
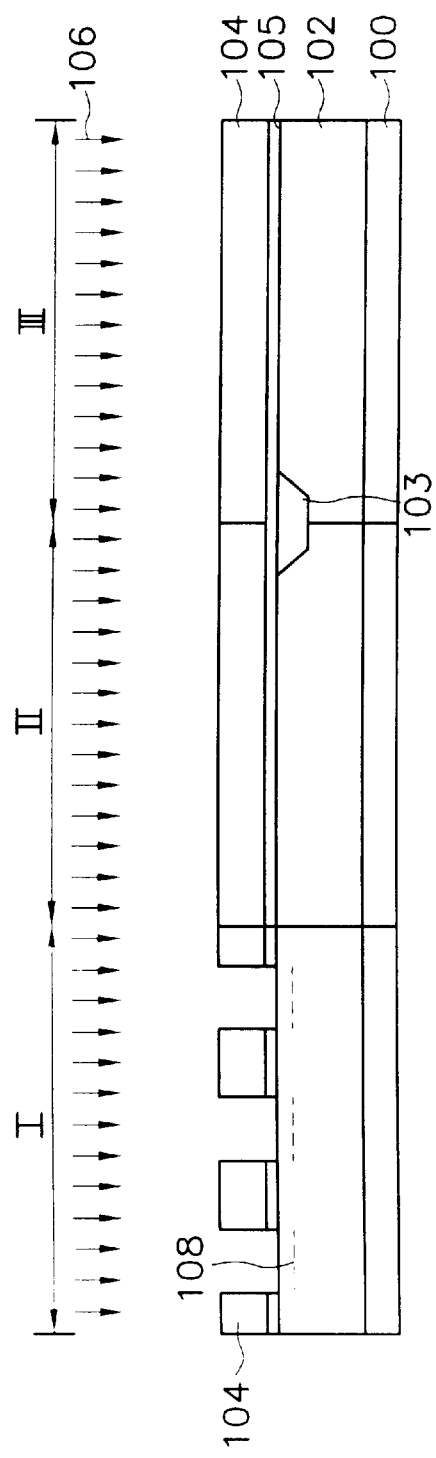
Figure 3C:
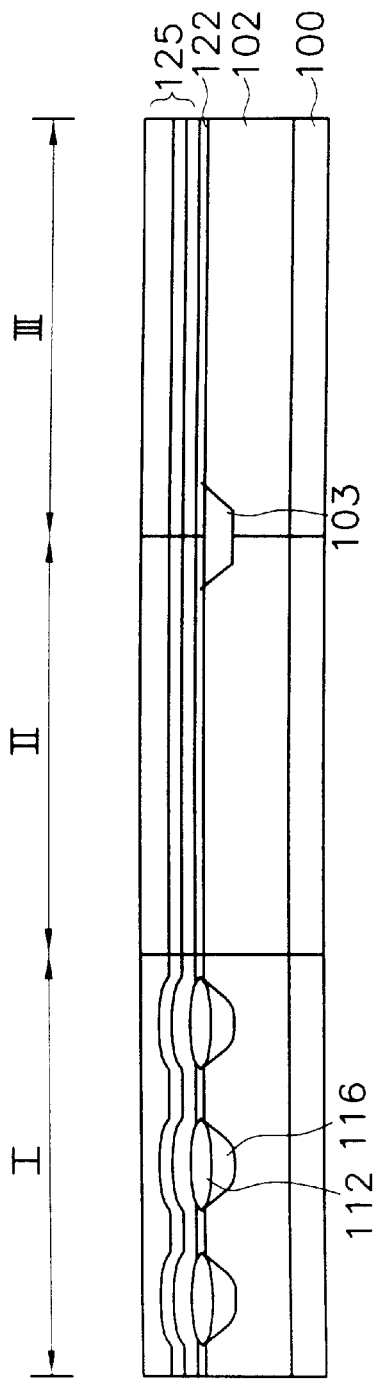
Figure 3D:
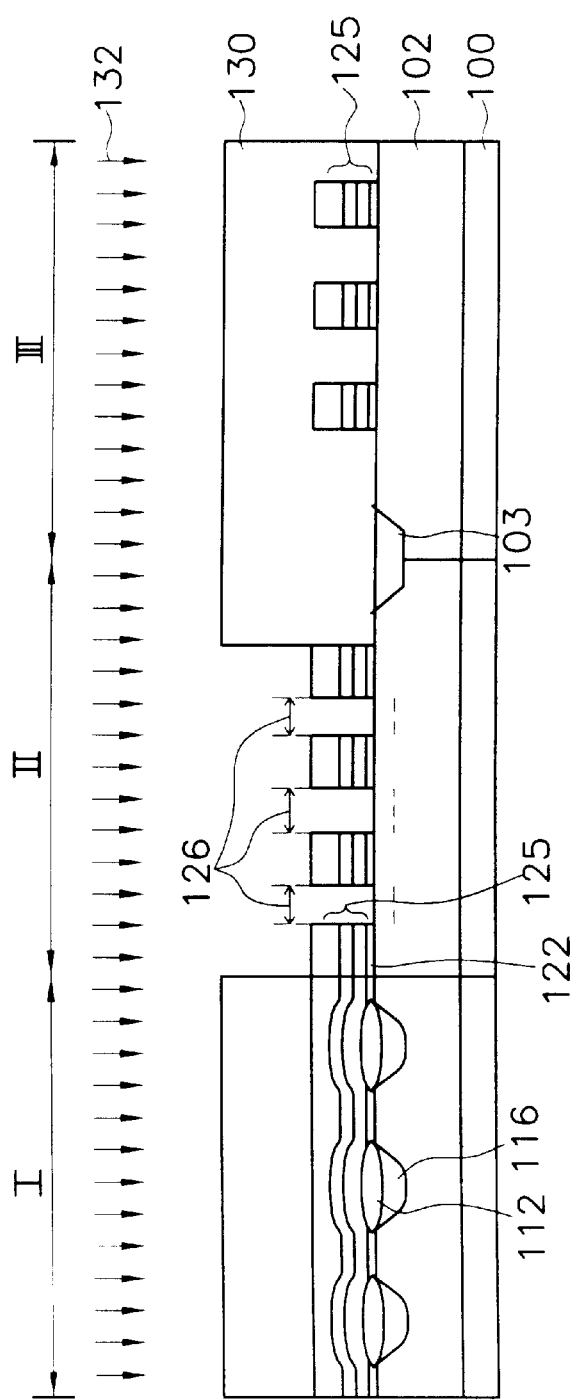
Figure 3E:
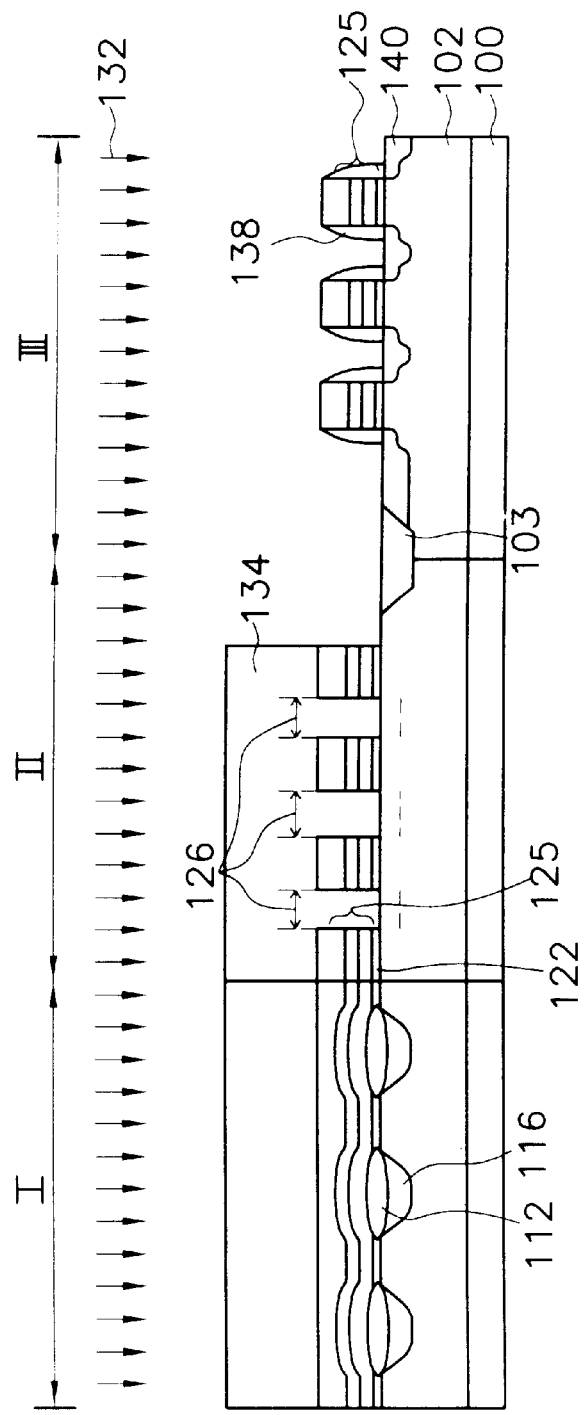
Figure 3F:
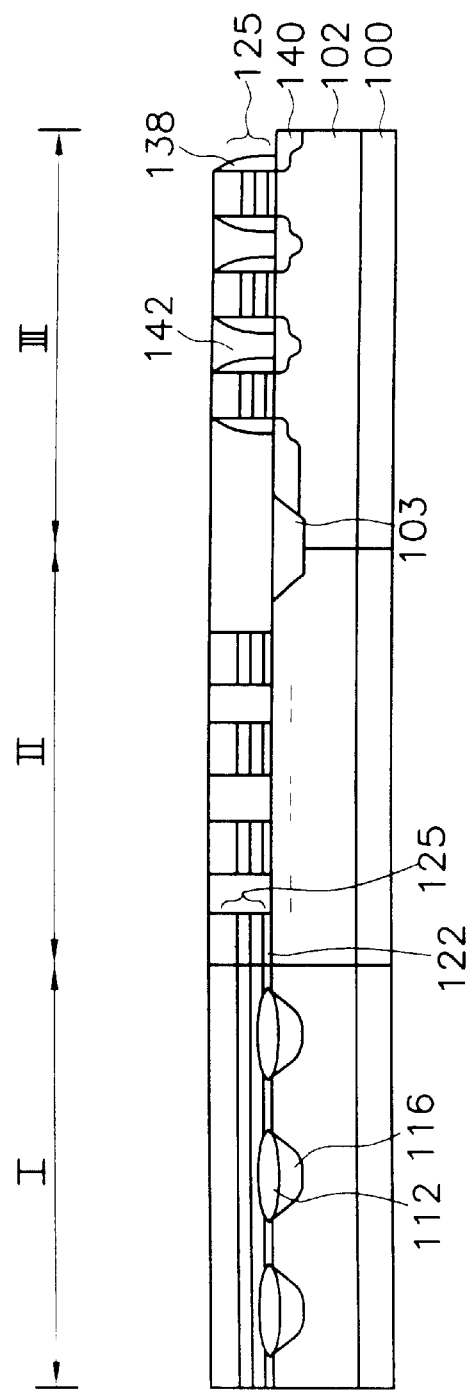
Figure 4A:
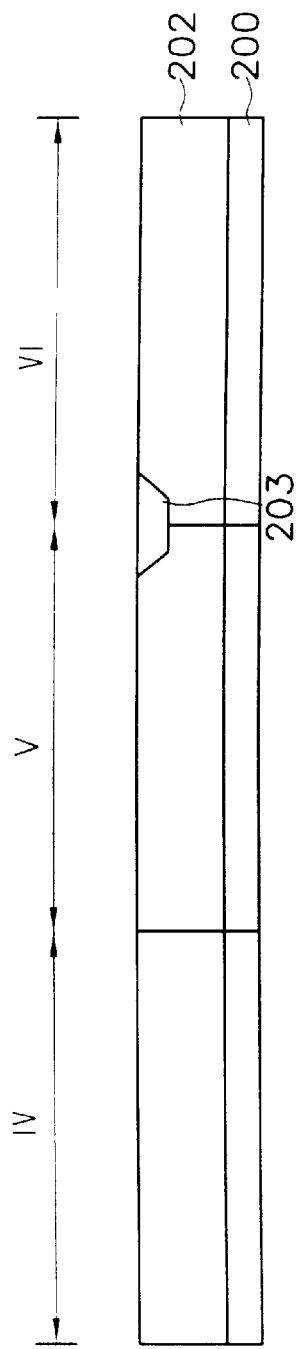
FIGS. 4a through 4g are cross-sectional diagrams illustrating sequential steps of a method for fabricating a mask ROM in accordance with the present invention.

As illustrated in FIG. 4a, an element isolating film 203 is formed according to a LOCOS or shallow trench isolation (STI) process at the outer portion of a memory cell array region IV+V of a substrate 200 where the memory cell array region IV+V and a peripheral region VI are defined.

A well 202 is formed on the substrate 200 having the element isolating film 203. Here, the element isolating film formation process and the well formation process may be formed in an inverse order.

Figure 4B:
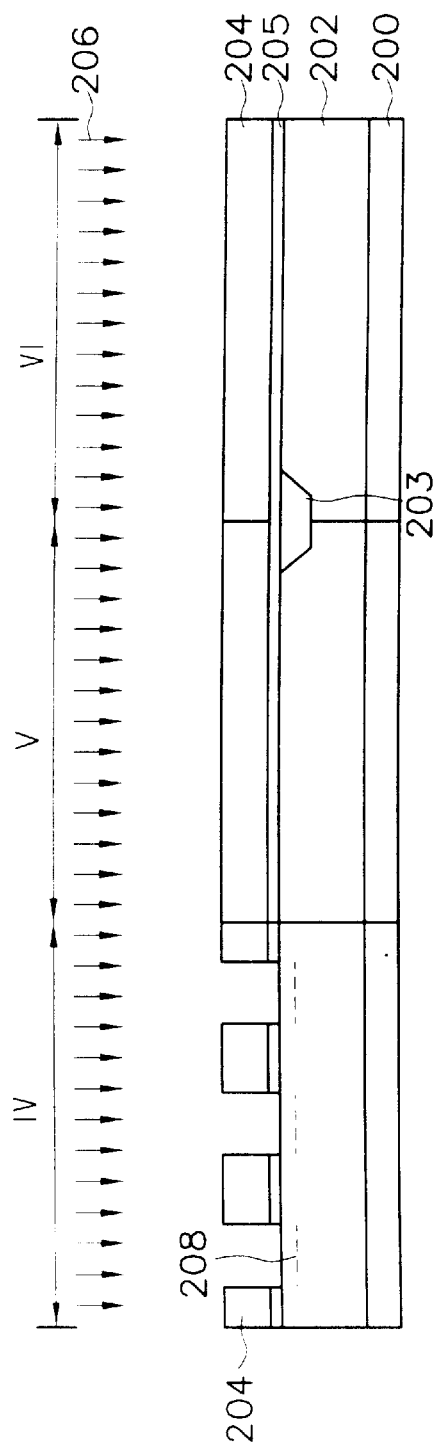
Figure 4C:
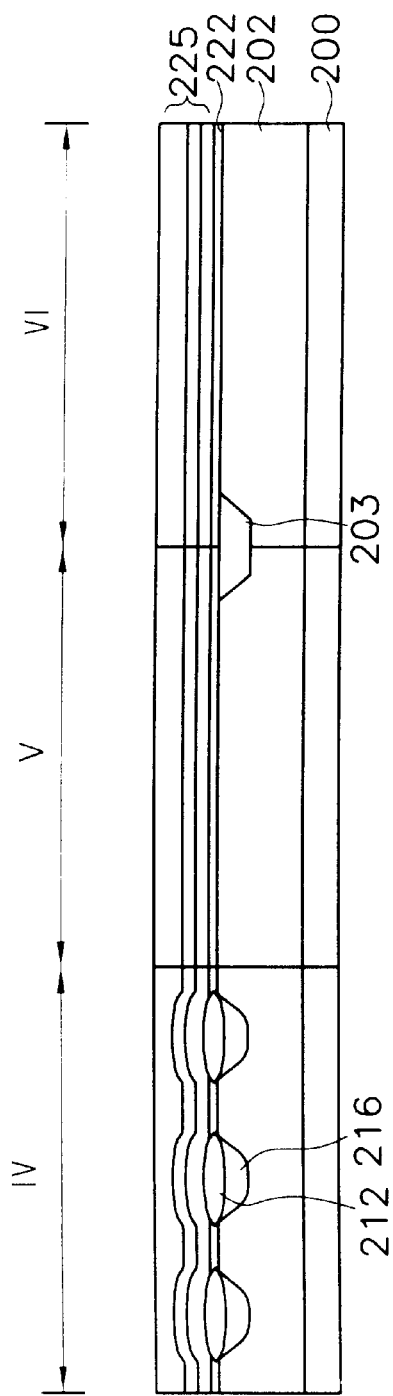

Referring to FIG. 4b, a photoresist film is coated on the substrate 200 having the element isolating film 203 and the well 202, and exposed and developed to form a first photoresist film pattern 204 opening a predetermined region. Reference numeral 205 denotes a buffer oxide film.

An N-type $As^+$ ion implant process 206 is performed on the substrate 200 by using the first photoresist film pattern 204 as a mask. Reference numeral 208 denotes an $As^+$ ion layer.

Then, the first photoresist film pattern 204 is removed, and a thermal treatment is carried out on the As+ implanted substrate 200. Here, As+ ions are diffused according to the thermal treatment, thereby forming a buried layer 216. At the same time, an oxide film 212 is formed on the buried layer 216.

A gate insulating film 222 is deposited on the substrate 200 having the buried layer 216 and the oxide film 212, and a gate formation material layer 225 is formed on the gate insulating film 222. The gate formation material layer 225 is formed by depositing a silicon layer such as a doped polysilicon or amorphous silicon layer, a high melting point metal layer such as a Ti or W layer having a low resistance value, and a nitride film.

Figure 4D:
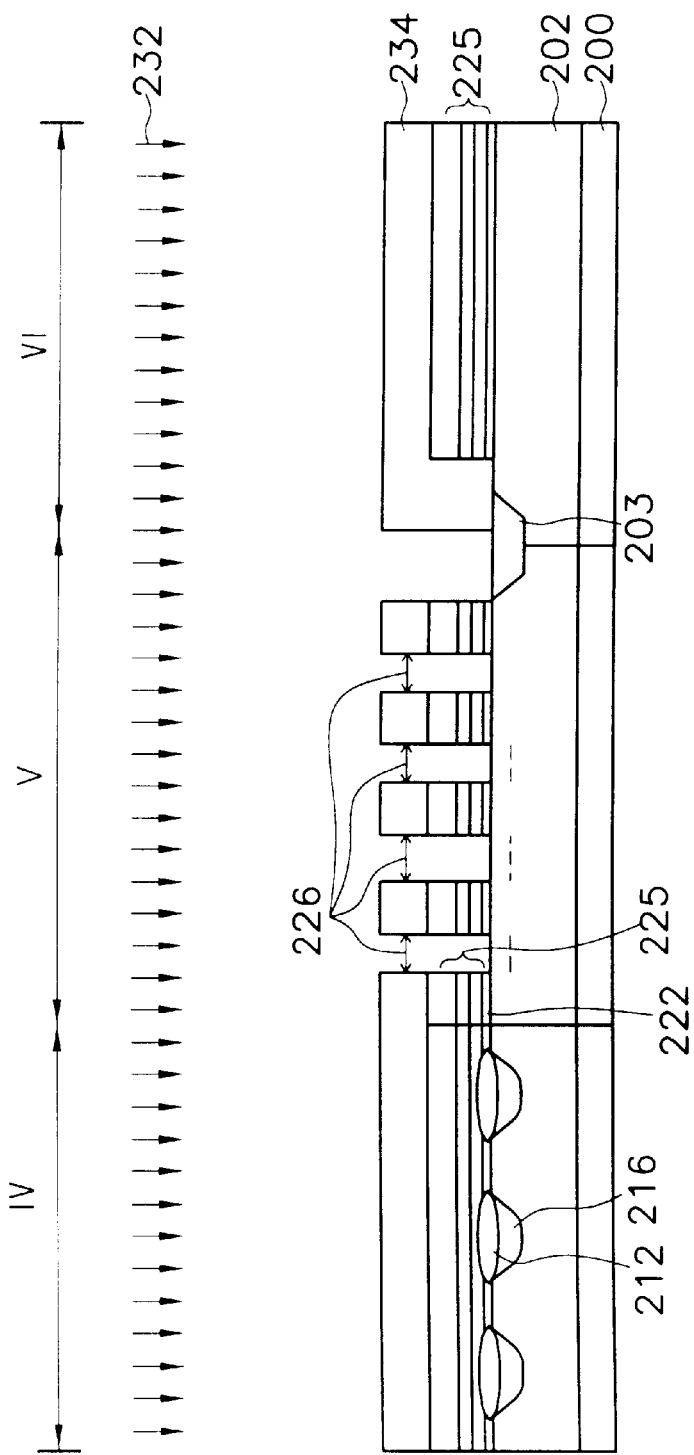

As depicted in FIG. 4d, a photoresist film is coated on the substrate 200 having the gate formation material layer, and exposed and developed to form a second photoresist film pattern 234 covering the gate formation region 225 of the peripheral region VI and the memory cell array region IV+V.

The gate formation material layer 225 is etched by using the second photoresist film pattern 234 as a mask, to form gates 225 in the memory cell array region IV+V. Here, a silicon region 226 of the substrate 200 exposed in the etching process of the gate formation material layer is an interval between memory cell channels.

Thereafter, an ion implant process for cell isolation 232 is performed on the intervals 226 between the channels of the memory cell array region IV+V, by employing the second photoresist film pattern 234 as a mask.

Figure 4E:
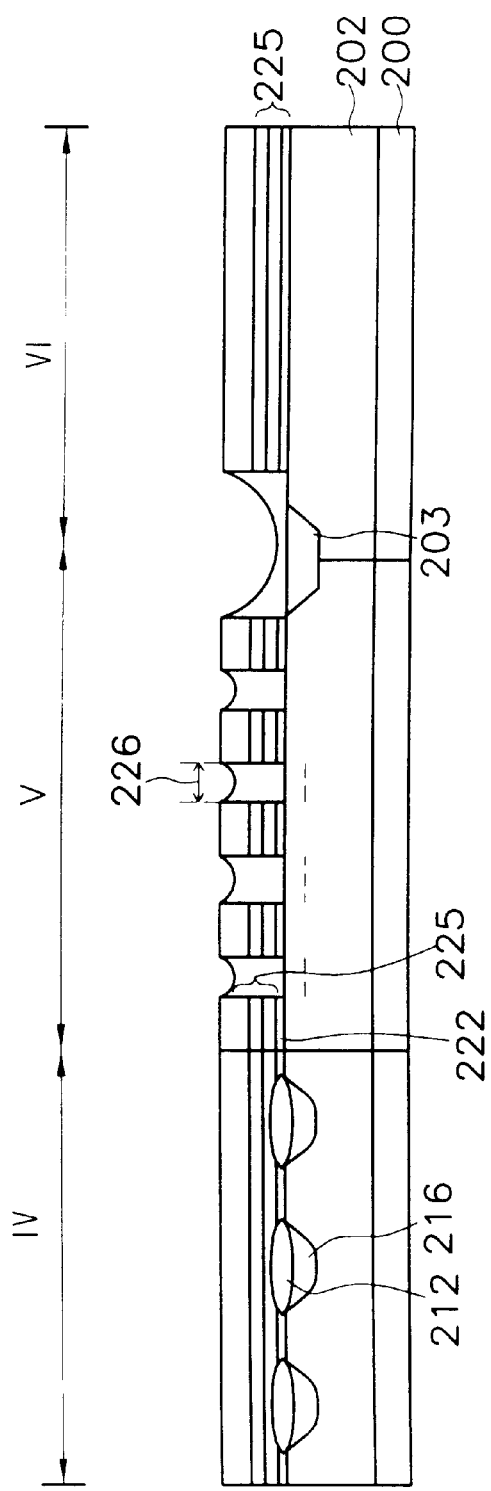

The second photoresist film pattern 234 is removed. As shown in FIG. 4e, a BPSG protective film 226 is deposited on the substrate 200 to fill up the space between the gates 225 of the memory cell, and planarized according to an etch back process or a chemical mechanical polishing process.

Figure 4F:
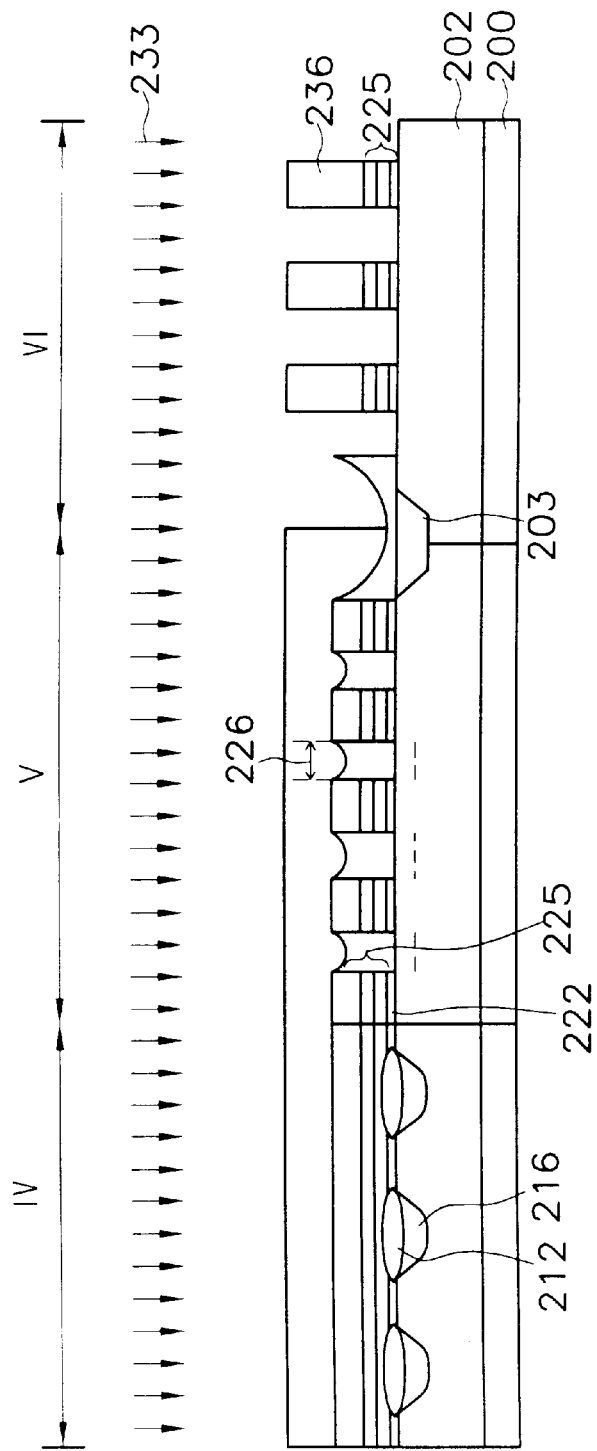

Referring to FIG. 4f, a photoresist film is coated on the substrate 200 having the protective film 226, and exposed and developed to form a third photoresist film pattern 236 covering the gate formation region of the memory cell array region IV+V and the peripheral region VI.

The gates 225 are formed in the peripheral region by using the third photoresist film pattern 236 as a mask.

Then, LDD ions are implanted to the substrate 200 at both sides of the gate 225 of the peripheral region VI, by using the third photoresist film pattern 236 as a mask.

Figure 4G:
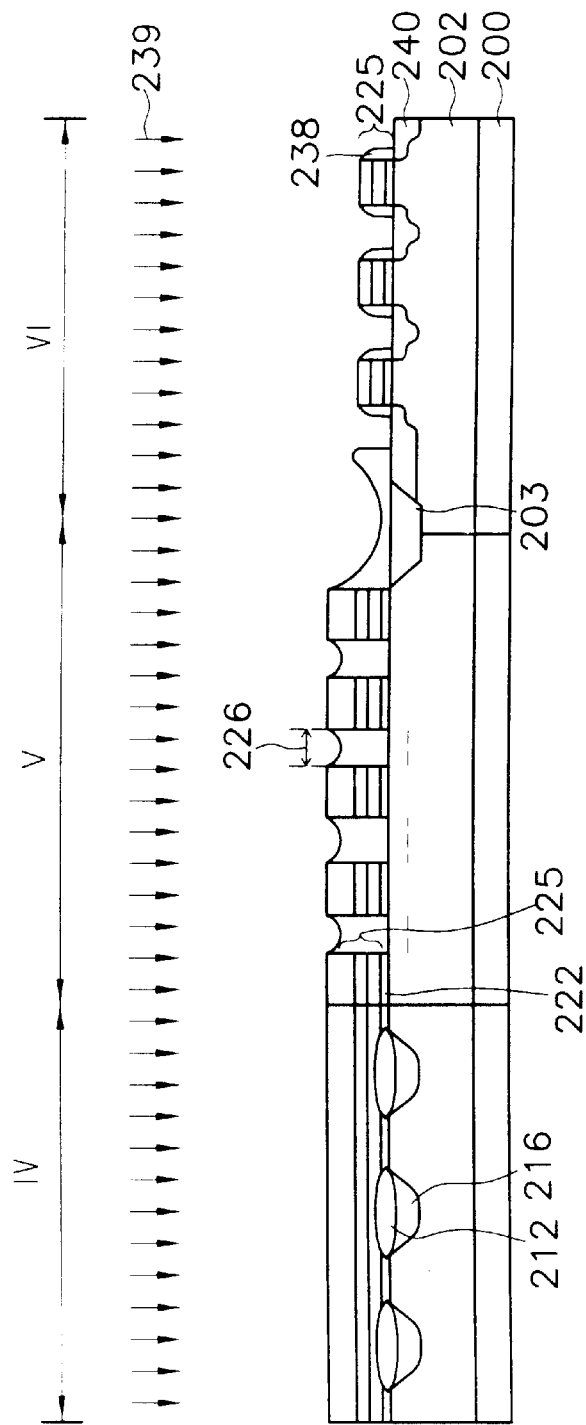

The third photoresist film pattern 236 is removed. As illustrated in FIG. 4g, an insulating spacer 238 is formed at the side walls of the gate 225 of the peripheral region VI. An impurity implant process 239 is performed on the substrate 200 by employing the insulating spacer 238 including the gate 225 as a mask, thereby forming Ti-Salicide or W-Salicide on the gate 225 of the memory cell array region IV+V and simultaneously forming a source/drain 240 at both sides of the gate 225 of the peripheral region VI.

That is, impurity doping and salicide are formed in the gates 225 of the memory cell except the peripheral region VI, but not formed in a space between the gates 225 of the memory cell.

A data coding ion implant process is carried out to record data, a contact hole (not shown) is formed on the buried layer of the segment select region not shown), and a bit line (not shown) of the memory cell is formed. Therefore, fabrication of the flat cell type mask ROM is finished.

As discussed earlier, in accordance with the present invention, the flat cell type mask ROM can be fabricated according to the gate doping process and the salicide process of the logic process, thereby achieving compatibility with the logic process of a design rule below 0.25 μm.

In addition, the source/drain ion implant process of the peripheral region and the gate doping process of the memory cell array region are performed at the same time, thus simplifying the fabrication process.

The ion implant process for channel isolation is carried out by using the gate formation mask of the memory cell array region, thereby reducing a number of the mask processes.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a mask ROM comprising the steps of:

providing a substrate where a memory cell array region and a peripheral region are defined;

forming a buried layer on the substrate;

forming a gate material layer by positioning a gate insulating film on the substrate having the buried layer;

forming first gates in the memory cell array region, by covering the peripheral region, and etching the gate material layer according to a photolithography process;

forming an insulating pattern on the substrate to fill up a space between the first gates and expose the surfaces of the first gates;

forming second gates in the peripheral region, by covering the memory cell array region, and etching the gate material layer according to the photolithography process; and forming a low resistance layer on the first gates, and simultaneously forming a source/drain at both sides of the second gates, by doping an impurity to the substrate having the first and second gates.

2. The method according to claim 1, wherein the step for forming the insulating pattern comprises the steps of:

forming an insulating layer on the substrate having the first gates to fill up a space between the first gates; and etching the insulating layer to expose the surfaces of the first gates.

3. The method according to claim 1, wherein the insulating layer is etched according to an etch back process or a chemical mechanical polishing process.

4. The method according to claim 1, wherein the first gate material layer is formed by sequentially depositing a silicon layer such as a doped polysilicon or amorphous silicon layer, and a metal layer such as a Ti or Co layer.

5. The method according to claim 1, wherein the low resistance layer is one of Ti-Salicide and Co-Salicide.

6. The method according to claim 1, further comprising the steps of:

forming an element isolating film at the outer portion of the memory cell array region; and forming a well on the substrate having the element isolating film, before forming the gate material by positioning the gate insulating film on the substrate.

7. The method according to claim 1, further comprising the steps of:

forming a well on the substrate; and forming an element isolating film at the outer portion of the memory cell array region of the substrate having the well, before forming the gate material by positioning the gate insulating film on the substrate.

8. The method according to claim 6, wherein the element isolating film is formed according to a LOCOS process.

9. The method according to claim 6, wherein the element isolating film is formed according to a shallow trench isolation process.

10. The method according to claim 1, further comprising the steps of:

forming insulating spacers at both sides of the second gates; and forming an LDD by doping an impurity to the substrate by using the insulating spacer including the second gates as a mask, before forming the low resistance layer on the first gates and forming the source/drain at both sides of the second gates.

* * * * *